United States Patent
Ito

(10) Patent No.: US 6,809,039 B2
(45) Date of Patent: Oct. 26, 2004

(54) METHOD FOR FORMING A SILICIDE LAYER

(75) Inventor: Takamasa Ito, Tokyo (JP)

(73) Assignee: NEC Electronics Corporation (JP)

( * ) Notice: Subject to any disclaimer, the term of this patent is extended or adjusted under 35 U.S.C. 154(b) by 11 days.

(21) Appl. No.: 09/940,247

(22) Filed: Aug. 27, 2001

(65) Prior Publication Data

US 2002/0031915 A1 Mar. 14, 2002

(30) Foreign Application Priority Data

Aug. 29, 2000 (JP) ........................................ 2000-259226

(51) Int. Cl.$^7$ ............................................ H01L 21/302
(52) U.S. Cl. ........................ 438/745; 438/750; 438/751; 216/103
(58) Field of Search ................................ 438/745, 750, 438/751, 749; 216/103, 106, 108

(56) References Cited

U.S. PATENT DOCUMENTS

| 4,713,358 A | * | 12/1987 | Bulat et al. ................. 438/193 |
| 6,033,537 A | * | 3/2000 | Suguro ..................... 204/192.2 |
| 6,074,960 A | * | 6/2000 | Lee et al. .................... 438/749 |
| 6,251,777 B1 | * | 6/2001 | Jeng et al. ................... 438/682 |

FOREIGN PATENT DOCUMENTS

| JP | 7-283168 | 10/1995 | ........... H01L/21/28 |
| JP | 2559669 | 9/1996 | ........... H01L/21/28 |
| JP | 2565665 | 10/1996 | ....... H01L/21/3205 |
| JP | 11-233456 | 8/1999 | ........... H01L/21/28 |
| JP | 2000-31091 | 1/2000 | ........... H01L/21/28 |

* cited by examiner

Primary Examiner—Lan Vinh
(74) Attorney, Agent, or Firm—Hayes Soloway P.C.

(57) ABSTRACT

A method for forming a metal silicide layer in a self-aligned manner on a source region and a drain region and a gate electrode of a semiconductor device formed on a semiconductor substrate, the method comprising the steps of: depositing a cobalt film over an entire surface of the semiconductor device formed on the semiconductor substrate, forming the metal silicide layer on the source region and drain region and the gate electrode by performing a heat treating thereof, and etching away an unreacted cobalt remaining on the semiconductor substrate using an admixture solution made of hydrochloric acid, hydrogen peroxide, and water, having relative concentration ratio ranging from 1:1:5 to 3:1:5, at a solution temperature of 25 to 45° C., with an etching time of 1 to 20 minutes.

5 Claims, 5 Drawing Sheets

METHOD FOR FORMING A SILICIDE LAYER

BACKGROUND OF THE INVENTION

1. Field of the Invention

The present invention relates to a method for fabricating a semiconductor device, and more particularly to a method for forming a silicide layer suitable for the formation of a low-resistivity silicide layer.

2. Related Art

In implementing a high-speed shallow-junction device or mixed DRAM/logic device, the achievement of low-resistivity source and drain electrodes using a salicide (self-aligned silicide) process is essential, and from the standpoint of the fact that the width of lines formed on a substrate is extremely narrow and immunity to heat, cobalt silicide technology is used. In a salicide reaction process, if an impurity for suppressing a silicide reaction exists, local reactions occur in which a cobalt silicide region of uniformly low resistivity is not formed.

To improve on the local problem of the difficulty of forming cobalt silicide (bad formation), an investigation was conducted to determined what process was largely responsible for the bad formation in the cobalt salicide process. As a result, it was discovered that, in the process step of removing the unreacted cobalt and the oxidized cobalt film after the first sintering, by using a high etching temperature or making the etching time long, bad silicide formation occurs.

In the unexamined Japanese Patent Publication (KOKAI) No. 2000-31091 and Japanese Patent Publications No. 2559669 and No. 2565665, a method for forming a silicide layer on the semiconductor substrate is described. However technologies disclosed in these publication do not solve above-mentioned problem.

Accordingly, it is an object of the present invention to improve on the above-noted drawbacks of the prior art, and provide a method for forming a silicide layer, which is suitable for the formation of a low-resistivity silicide layer.

SUMMARY OF THE INVENTION

To achieve the above-noted objects, the present invention adopts the following basic technical constitution.

Specifically, an aspect of the present invention is a method for forming a metal silicide layer in a self-aligned manner on a source region, a drain region and a gate electrode of a semiconductor device formed on a semiconductor substrate, the method comprising the steps of: depositing a cobalt film over an entire surface of the semiconductor device formed on the semiconductor substrate, forming the metal silicide layer on the source region, drain region and the gate electrode by performing a heat treating thereof, and etching away an unreacted cobalt film remaining on the semiconductor substrate using an admixture solution made of hydrochloric acid, hydrogen peroxide, and water, having relative concentration ratio thereof ranging from 1:1:5 to 3:1:5, at a solution temperature of 25 to 45° C., with an etching time of 1 to 20 minutes.

DETAILED DESCRIPTION OF THE PREFERRED EMBODIMENTS

Embodiments of a method for forming a silicide layer according to the present invention are described in detail below, with references made to relevant accompanying drawings.

(First Embodiment)

Figure 1A:
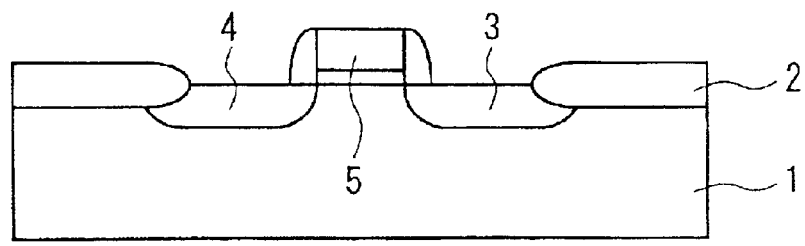
FIGS. 1(a) to (e) are cross-sectional views of a process diagram of a first embodiment for manufacturing a semiconductor device according to the present invention.
Figure 1B:
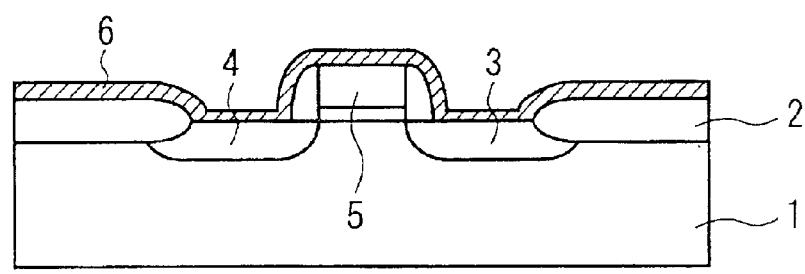
Figure 1C:
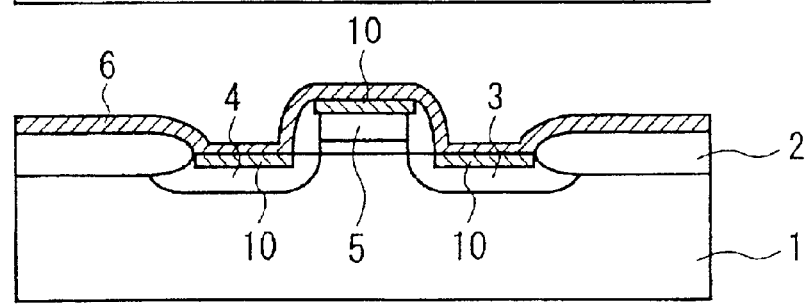
Figure 1D:
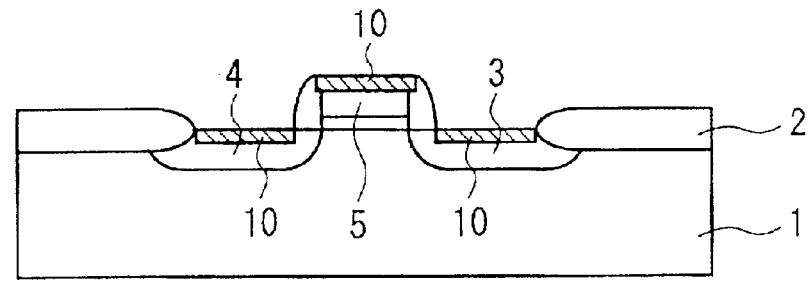
Figure 1E:
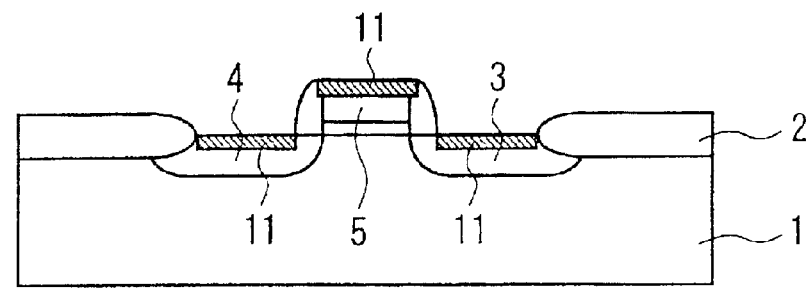
Figure 2A:
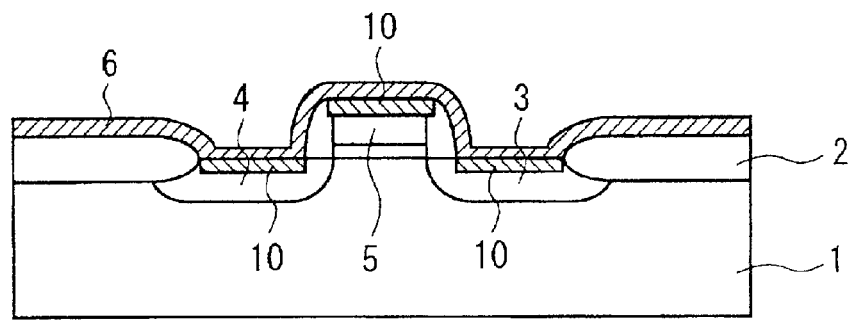
FIGS. 2(a) to (c) are drawings illustrating the difference between the present invention and the prior art.
Figure 2B:
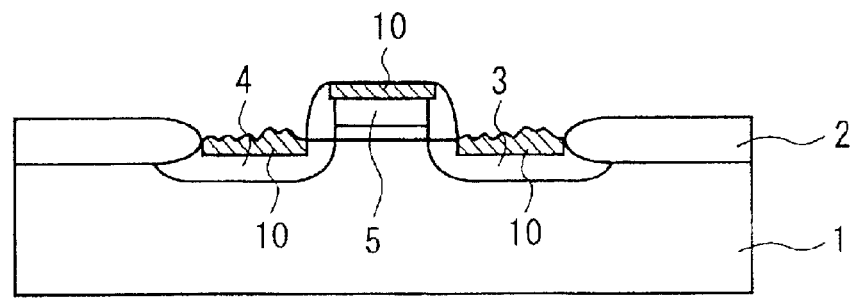
Figure 2C:
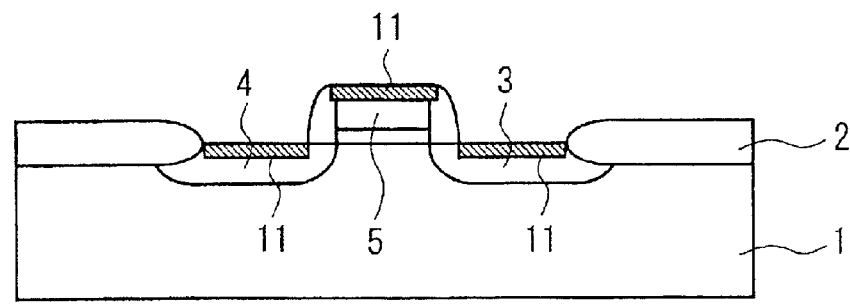
Figure 5:
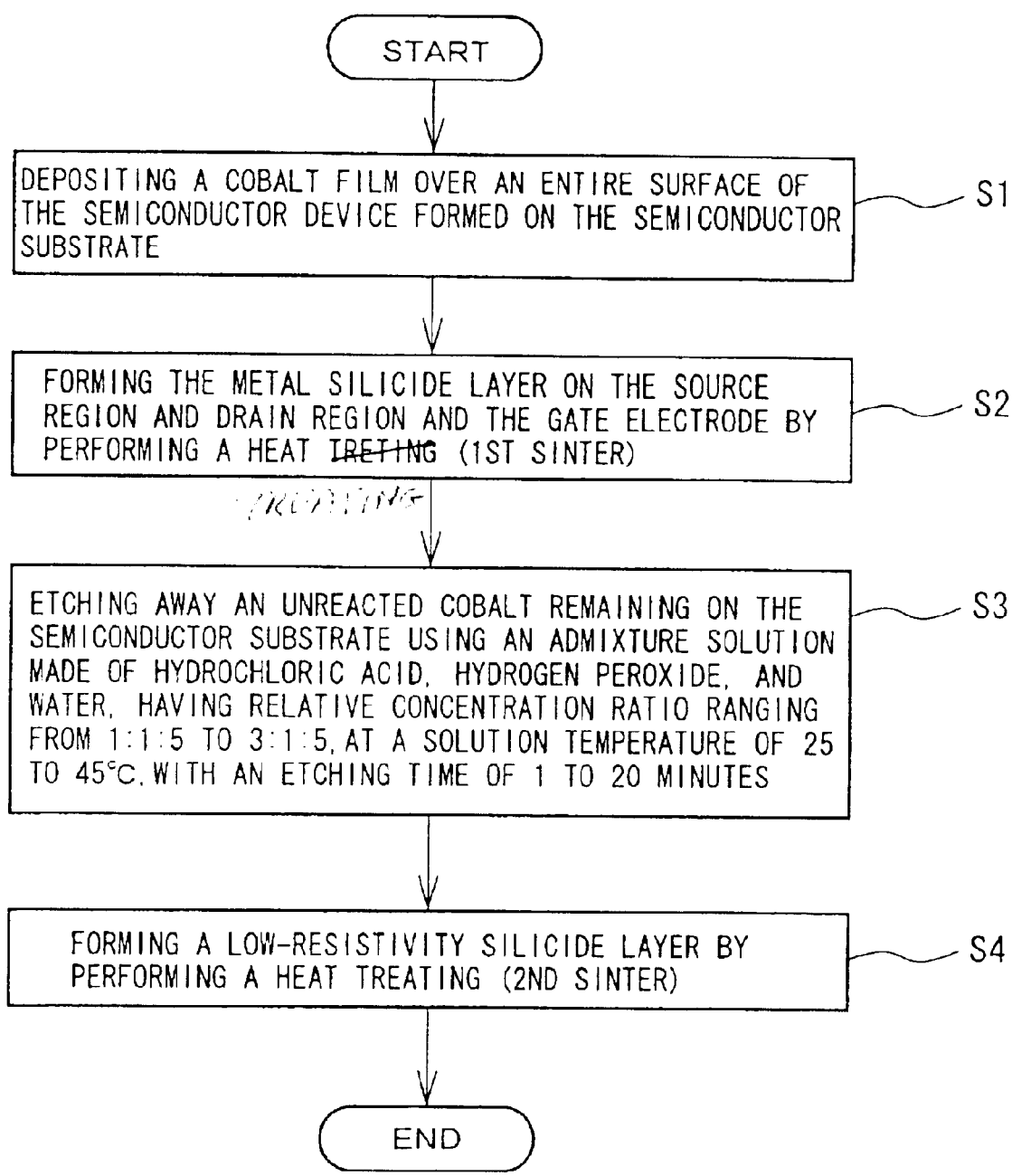
FIG. 5 is a flowchart showing a method of the present invention.
Figure 5:
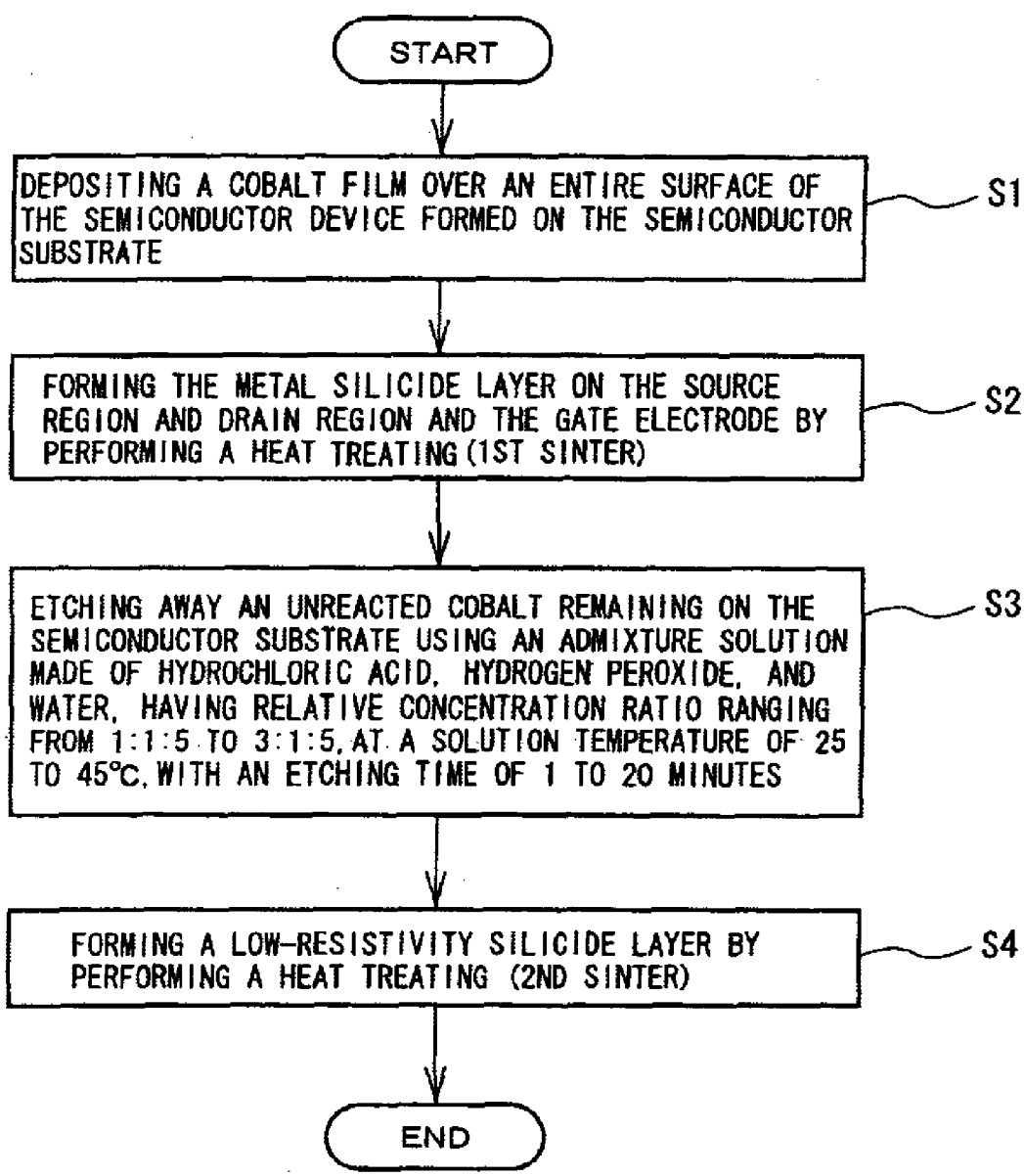

FIG. 1 and FIG. 2 are process drawings illustrating a first example of the present invention, and FIG. 5 is a flowchart showing a method of the present invention.

In the present invention, a cobalt film 6 is formed over the entire surface of a semiconductor substrate 1, onto which a transistor is formed, as shown in FIG. 1(b) (Step S1). This film is grown at a temperature of 200 to 500° C., using a magnetron sputtering method. Next, this is heat treated for 30 seconds in an inert gas atmosphere, such as nitrogen, at a temperature of 500° C. or higher, so as to form a dicobalt silicide film ($Co_2Si$), a cobalt monosilicide film (CoSi), and a cobalt disilicide film ($CoSi_2$) thereon (First sinter) (Step S2) When this is done, the cobalt silicide film 10, as shown in FIG. 1(c), is formed in self-aligned manner over only the gate electrode 5 and the diffusion layers 3 and 4. Then the semiconductor substrate 1 is immersed in an admixture solution made of hydrochloric acid, hydrogen peroxide, and water (HPM), so as to perform selective etching, thereby removing unreacted or partially oxidized cobalt from the top of the field oxide film 2 and the side wall film formed on the semiconductor substrate 1 FIG. 1(d)). When performing this process of etching away excess cobalt, because to avoid excessive etching of the silicide film on the gate electrode 5 surface, source and drain regions 3 and 4, it is necessary to optimize the etching conditions, so that the concentration ratios of the hydrochloric acid, hydrogen peroxide, and water are set in the range from 1:1:5 to 3:1:5, the HPM solution temperature is made 25 to 45° C. and the etching time is made 1 to 20 minutes (Step 53). Next, heat treating at a temperature higher than the first sintering is done, for example, at 800° C. for 10 seconds (FIG. 1(e)). As a result, a uniform, low- resistivity cobalt disilicide ($CoSi_2$) 11 is formed (Second sinter) (Step S4).

Next, the above-noted process of etching away the excess cobalt is described below, with reference to FIG. 2.

After the first sintering, depending upon the temperature used, one or a mixture of a dicobalt silicide film, a cobalt monosilicide film, and a cobalt disilicide film are formed. In this condition, in order to remove unreacted or partially oxidized cobalt from the field oxide film 2 and the side walls 12, selective etching (cobalt etching) is performed. When doing this, however, if excessive etching is done, specifically, if etching is done for a long period of time, the etching solution intrudes into the crystal from the crystal grain boundaries of the cobalt silicide, resulting in an unstable cobalt silicide film which is formed under the influence of the underlayer, for example, the implantation of an impurity, being etched, so that there is a localized etching 10a of the silicide film 10 (FIG. 2(b)). In this condition, even if a subsequent second sintering is done, it is not possible to form a uniform, low-resistivity cobalt silicide film.

To solve the above-described problem, in a process step for removing unreacted cobalt or a cobalt oxide, it is necessary to reduce the etching rate or to avoid immersion in the etching solution for an excessively long time, thereby only the unreacted cobalt or partially oxidized cobalt film is removed, without influencing the silicide film. In an experiment with the present invention, it was found that the optimum etching is done with an admixture solution made of a hydrochloric acid, hydrogen peroxide, water, the admixture solution having relative concentration ratio ranging From 1:1:5 to 3:1:5, at a solution temperature of 25 to 45° C. with an etching time of 1 to 20 minutes. For example, if etching is done with an etching solution temperature of 35° C. for an etching time of 3 minutes, only the unreacted cobalt and cobalt oxide are etched, with absolutely no etching of the silicide layer (FIG. 2(c)). After this, by performing a second sintering a uniform, low-resistivity cobalt silicide ($CoSi_2$) film 11 is formed. The occurrence of failures was found to be highly dependent on the concentration and temperature of the etching solution, and the etching time.

In the case in which the etching solution concentration and temperature and the etching time are below the above-noted ranges, it is not possible to completely remove unreacted cobalt and the cobalt oxide, and in the case in which the etching solution concentration and temperature and the etching time are above the above-noted ranges, the silicide layer itself is etched. These results show that the above-noted ranges are the optimum etching conditions.

(Second Embodiment)

Figure 3A:
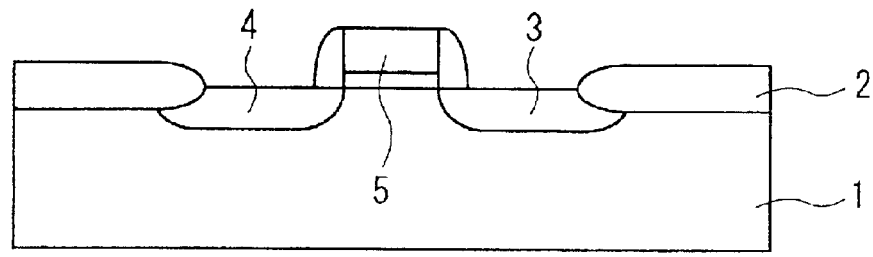
FIGS. 3(a) to (c) are cross-sectional views of a process diagram of a second embodiment for manufacturing a semiconductor device according to the present invention.

A second example of the present invention is described below, with reference made to FIG. 3 and FIG. 4.

Figure 3B:
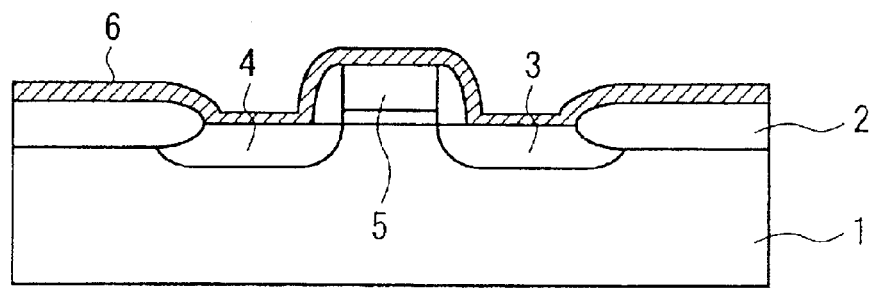
Figure 3C:
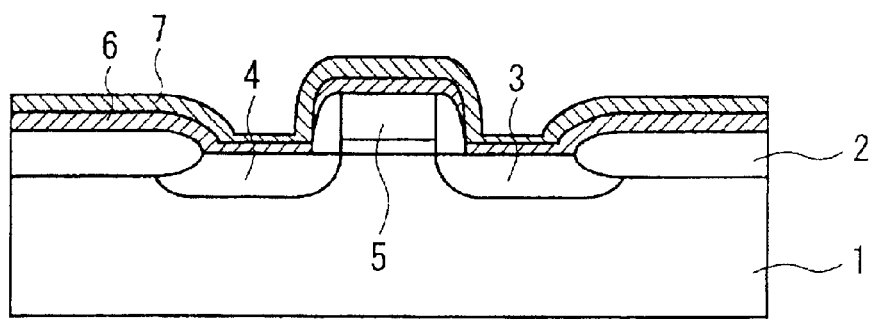
Figure 4A:
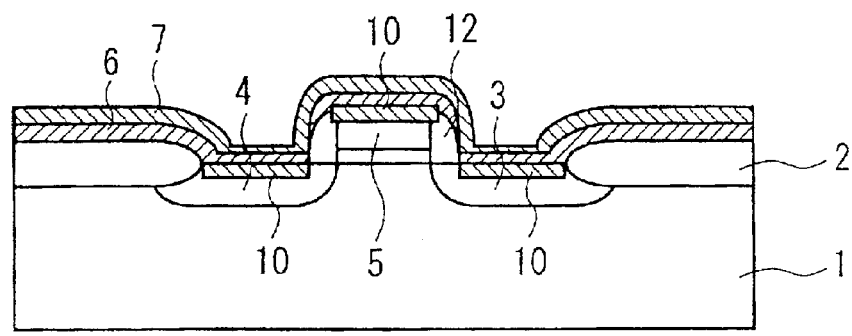
FIGS. 4(a) to (d) are cross-sectional views of a process diagram of a second embodiment for manufacturing a semiconductor device according to the present invention.
Figure 4B:
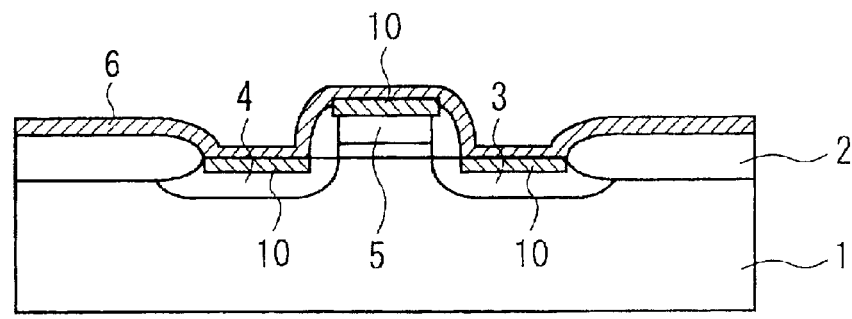
Figure 4C:
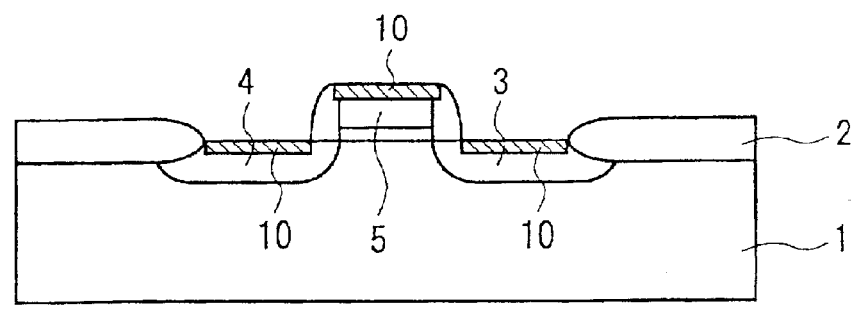
Figure 4D:
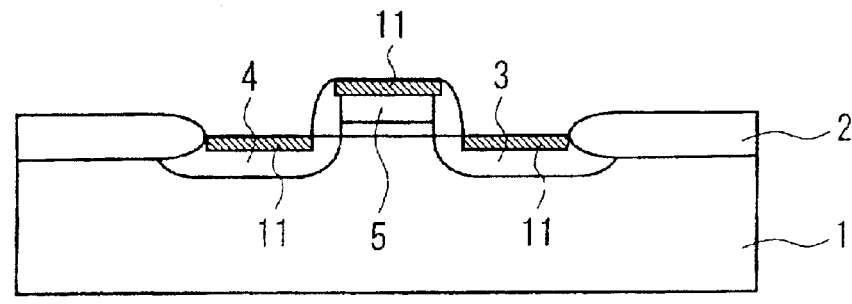

First, a cobalt film 6 is formed over the entire surface of a semiconductor substrate 1, onto which a transistor is formed, as shown in FIG. 3(b). After the cobalt film 6 is formed, a titanium (Ti) or titanium nitride (TiN) film 7 is formed so as to cover the cobalt film 6 and prevent the oxidation thereof (FIG. 3(c)). The method of forming these films is either a magnetron sputtering method or vapor deposition. In this condition, heat treating is clone in an inert gas atmosphere for 10 to 60 seconds at a temperature of 500° C. or higher, so as to form a dicobalt silicide film, a cobalt monosilicide film, or a cobalt disilicide film (First sintering) When this is done, the cobalt silicide film 10 is formed in self-aligning manner over only the gate electrode 5 and the diffusion layers 3 and 4 (FIG. 4(a)). Next, in order to remove the titanium or titanium nitride film 7 formed as a cap film to prevent oxidation of the cobalt film 6, the silicon substrate 1 is immersed in an admixture solution made of ammonia, hydrogen peroxide, and water (APM) (FIG. 4(b)). After this is done, the silicon substrate 1 is immersed in an admixture solution of hydrochloric acid, hydrogen peroxide, and water (HPM) so as to remove only the unreacted cobalt or partially oxidized cobalt from the field oxide film 2 and the side wall film 12 by selective etching (FIG. 4(c)). When this is done, in order to avoid etching of the silicide film formed on the source and drain regions 3 and 4 and the gate electrode 5 by excessive etching, the etching conditions used are a relative concentration ratio of hydrochloric acid, hydrogen peroxide, and water in the range from 1:1:5 to 3:1:5, an HPM solution temperature in the range from 25 to 45° C., and an etching time of 1 to 20 minutes. Next, heat treating is done for 10 to 60 seconds at a temperature higher than that of the first sintering (FIG. 4(d)). As a result, a uniform, low-resistivity cobalt disilicide film 11 is formed.

In a process step of removing unreacted cobalt or a partially oxidized cobalt film in a method for manufacturing a semiconductor device according to the present invention, by setting the relative concentration ratio of an etching solution made of an admixture of hydrochloric acid, hydrogen peroxide, and water in the range from 1:1:5 to 3:1:5, the temperature of the solution in the range 25 to 45° C., and the etching time between 1 and 20 minutes, even in the case in which there exists an unbalanced dicobalt silicide film, a cobalt monosilicide film, and a cobalt disilicide film on the gate electrode or the diffusion layers, it is possible to remove only unreacted cobalt or a partially oxidized cobalt film, without etching the silicidized cobalt film. Therefore, in a subsequent process step it is possible by high-temperature processing to form a uniform, low-resistivity cobalt disilicide film, resulting in the superior effect of improving the yield and improving long-term reliability.

What is claimed is:

1. A method for forming a metal silicide layer in a self-aligned manner on a source region, a drain region and a gate electrode of a semiconductor device formed on a semiconductor substrate, said method comprising the steps of:

(A) depositing a cobalt film over an entire surface of said semiconductor device formed on said semiconductor substrate, (B) forming a silicidized cobalt film layer on said source region, drain region and said gate electrode by performing a heat treating thereof, and (C) etching away an unreacted cobalt film remaining on said semiconductor substrate while leaving the nietal-silieide silicidized cobalt film layer intact, using as an etching solution an admixture solution consisting essentially of hydrochloric acid, hydrogen peroxide, and water, having relative concentration ratio thereof ranging from 1:1:5 to 3:1:5, at a solution temperature of 25 to 45° C., with an etching time of 1 to 20 minutes.

2. The method as claimed in claim 1, wherein said silicidized cobalt film layer comprises a silicidized cobalt selected from the group consisting of dicobalt silicide, cobalt monosilicide and cobalt disilicide.

3. The method according to claim 1, wherein said heat treating of step (B) is conducted at a temperature of 500° C. or higher.

4. The method as claimed in claim 3, and further comprising a Step (D) of heat treating the product resulting from Step (C) at a temperature higher than a temperature of heat treating in Step (B).

5. The method as claimed in claim 4, wherein said heat treating of Step (D) is conducted at a temperature of 800° C.

* * * * *

UNITED STATES PATENT AND TRADEMARK OFFICE
CERTIFICATE OF CORRECTION

PATENT NO.    : 6,809,039 B2
DATED         : October 26, 2004
INVENTOR(S)   : Ito It is certified that error appears in the above-identified patent and that said Letters Patent is hereby corrected as shown below:

Drawings,
Fig. 5 should be deleted and substituted with the attached drawing herein.
Figure 5, Box S2, "treting" should be -- treating --.

Column 4,
Lines 39-40, delete the word "nietalsilieide".

Signed and Sealed this

Twenty-fifth Day of January, 2005

JON W. DUDAS
*Director of the United States Patent and Trademark Office*